(12) United States Patent
Reid et al.

(10) Patent No.: US 7,830,927 B2
(45) Date of Patent: Nov. 9, 2010

(54) BRAGG GRATING REFLECTION STRENGTH CONTROL

(75) Inventors: Douglas Charles John Reid, Rugby (GB); Andrew John Ward, Northampton (GB)

(73) Assignee: Oclaro Technology Limited, Northamptonshire (GB)

( * ) Notice: Subject to any disclaimer, the term of this patent is extended or adjusted under 35 U.S.C. 154(b) by 230 days.

(21) Appl. No.: 12/088,131

(22) PCT Filed: Sep. 26, 2006

(86) PCT No.: PCT/GB2006/050303
§ 371 (c)(1),
(2), (4) Date: Mar. 26, 2008

(87) PCT Pub. No.: WO2007/036750
PCT Pub. Date: Apr. 5, 2007

(65) Prior Publication Data
US 2008/0240175 A1   Oct. 2, 2008

(30) Foreign Application Priority Data
Sep. 29, 2005   (GB) ................... 0519800.7

(51) Int. Cl.
*H01S 3/10* (2006.01)
(52) U.S. Cl. .............. 372/20; 372/50.1; 372/50.11; 372/102
(58) Field of Classification Search .......... 372/20, 372/50.1, 50.11
See application file for complete search history.

(56) References Cited

U.S. PATENT DOCUMENTS

| 5,040,188 | A | 8/1991 | Lang et al. |
| 5,379,318 | A | 1/1995 | Weber |
| 5,668,900 | A | 9/1997 | Little et al. |
| 6,141,370 | A | 10/2000 | Avrutsky et al. |
| 2003/0147432 | A1* | 8/2003 | Bukkems .............. 372/20 |

FOREIGN PATENT DOCUMENTS

| EP | 0 955 558 | 11/1999 |
| WO | 03/044578 | 5/2003 |

OTHER PUBLICATIONS

Great Britain Search Report for corresponding Application No. 0519800.7 dated Jan. 12, 2006.
International Search Report for corresponding PCT Application No. PCT/GB2006/050303 mailed Dec. 21, 2006.

(Continued)

*Primary Examiner*—Dung T Nguyen
(74) *Attorney, Agent, or Firm*—Renner, Otto, Boisselle & Sklar, LLP (57) ABSTRACT

A tunable laser comprises a gain section and two or more reflectors. At least one of the reflectors is a Bragg grating comprising a reduced strength section comprising a base order periodic pattern of marks and spaces from at which at least some of the marks or spaces are missing. This enables the reflective strength of the grating to be controlled relative to the other reflector. The Bragg grating may be a phase change grating with individual sections being reduced in strength by line removal.

18 Claims, 5 Drawing Sheets

OTHER PUBLICATIONS

Form PCT/ISA/237.

Y. Shibata et al.; "Coupling Coefficient Modulation of Waveguide Grating Using Sampled Grating"; IEEE Photonics Technology Letters; IEEE Service Center; Piscataway, NJ; vol. 6, No. 10; Oct. 1994; pp. 1222-1224; XP000476948.

Ivan A Avrutsky et al.; "Multiwavelength Diffraction and Apodization Using Binary Superimposed Gratings"; IEEE Photonics Technology Letters; IEEE Service Center, Piscataway, NJ; vol. 10, No. 6, Jun. 1998; XP011046068.

V. Jayaraman et al.; "Demonstration of Broadband Tunability in a Semiconductor Laser Using Sampled Gratings"; Applied Physics Letters, AIP, American Institute of Physics; Melville, NY; vol. 60, No. 19; May 1992; pp. 2321-2323; XP000275872.

M.D. Mermelstein et al.; "Configurable Three-Wavelength Raman Fiber Laser for Raman Amplification and Dynamic Gain Flattening"; IEEE Photonics Technology Letters, IEEE Service Center; Piscataway,NJ; vol. 13, No. 12; Dec. 2001; XP011047873.

P-Y Cortès et al.; "Intrinsic Apodisation of Bragg Gratings Written Using UV-Pulse Interferometry"; Electronics Letters; IEE Stevenage, GB; vol. 34, No. 4; Feb. 1998; pp. 396-397; XP006009346.

* cited by examiner

BRAGG GRATING REFLECTION STRENGTH CONTROL

The present invention relates to the control of the reflective strength of a Bragg grating. In particular, although not exclusively, the invention relates to the reflective strength control of Bragg gratings for use in a tunable laser to assist balance of front and rear reflectors.

It will be understood that the terms "optical" and "optoelectronic" are used in this specification in a non-specific sense, that is so as to cover use with radiation in the visible and non-visible parts of the spectrum, and so as not to be limited to use with visible light. Similarly, it will be understood that use of the term "light" may apply to electromagnetic radiation of any frequency, and is not limited to light in the visible spectrum. Further it will be understood that the use of the term "waveguide" describes a structure that guides light and which may comprise a plurality of layers.

Tunable lasers are important for a number of applications in optical telecommunications and signal processing applications. The design and operation of tunable lasers is described, for example, in the article "Tunable Laser Diodes" by Markus-Christian Amann and Jens Buus (ISBN 0890069638). An exemplary design of tunable laser comprises a gain region bounded at one end by a reflector in the form of a Distributed Bragg Reflector (DBR) adapted to reflect a range of wavelengths (often known as a chirped grating), and at the other end by a DBR adapted to reflect a "comb" spectrum of discrete wavelength peaks.

Further designs of tunable laser are possible: U.S. Pat. No. 5,838,714 describes a three section DBR laser in which the DBR is segmented and composed of a repeating chirped pattern, with interdigitated electrodes connected such that each segment of grating is electrically connected in parallel with all other comparable sections. Thus it is electrically equivalent to a single chirped segmented grating, but optically will have more uniform attenuation of all wavelengths (due to the lossy nature of the grating).

U.S. Pat. No. 5,379,318 describes a tunable laser in which two segmented DBRs, one on either side of a gain section, are used that each produce a comb-like reflection spectrum, and the two spectra have interleaved peaks, such that an individual peak from one segment can be tuned to overlap that of a peak in the other DBR, in order to create and define an optical cavity that is above the lasing threshold.

Distributed Bragg gratings are commonly found in optical fibres and semiconductor optical devices. Such gratings in optical fibres are known as "Fibre Bragg Gratings" (FBGs) and those in semiconductor optical devices as "Distributed Bragg Reflectors" (DBRs).

In its simplest form, a Bragg grating comprises a periodic modulation of the refractive index of a waveguide. Light is scattered at each change in refractive index. If the Bragg condition is satisfied, the light reflected at each of the grating planes interferes constructively. The Bragg condition is defined as $\lambda_B = 2n_{eff}\Lambda$, where $\lambda_B$ is the wavelength of the incident light, $n_{eff}$ is the effective refractive index of the waveguide, and $\Lambda$ is the pitch of the modulation. A grating of constant pitch and reflective strength thus produces a reflection of light of a wavelength of twice the effective pitch of the grating, where the effective pitch differs from actual pitch by a factor of $n_{eff}$. Where DBRs are provided in a semiconductor waveguide, the grating is typically formed by etching a lithographic pattern in a chemical resist into the structure part of the way through epitaxial growth, and then overgrowing with a material of different refractive index. The lithographic patterns may be written holographically using an optical interference pattern, photolithographically by exposing through a mask onto a light sensitive resist (photoresist), or by electron-beam ("e-beam") lithography using e-beam sensitive resist.

Figure 1:
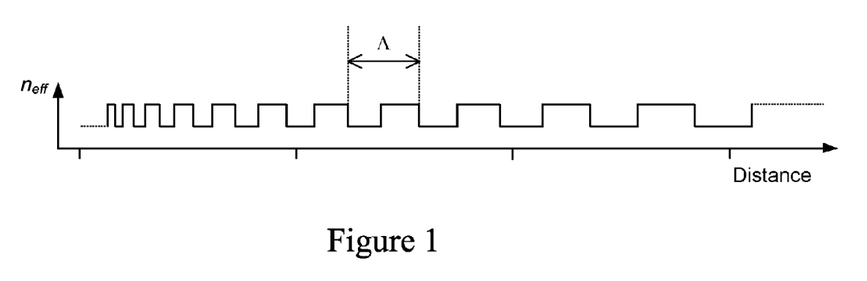
FIG. 1 is a schematic representation of a chirped Bragg grating.
Figure 2:
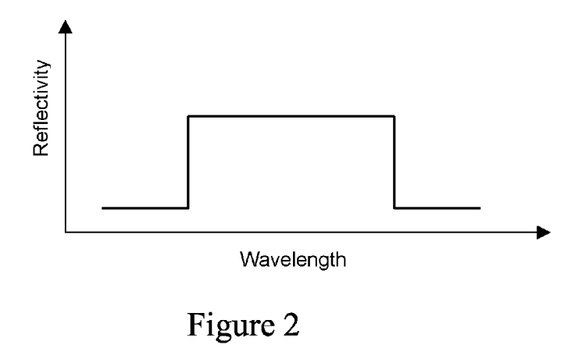
FIG. 2 is a graph showing the reflection spectrum of the grating of FIG. 1.

Bragg gratings can also be adapted to reflect a range of wavelengths, and these are known as chirped gratings. The pitch $\Lambda$ of a0 chirped grating varies along the length of the grating, commonly monotonically, as shown schematically in FIG. 1. A chirped grating of constant reflective strength should produce a reflection spectrum (reflectivity plotted against wavelength) in the shape of a "top hat", i.e. the reflection of the grating is substantially uniform within a specific wavelength range, as shown in FIG. 2. Chirped gratings are often incorporated into tunable semiconductor lasers as a reflector at one end of the gain region of the laser, and an example is shown in WO 03/012936. Further examples may be seen in U.S. Pat. No. 6,771,687, which provides an example of how FBGs may be used in an FBG stabilised laser, and U.S. Pat. No. 6,345,135, which illustrates applications of DBRs in semiconductor optoelectronic devices.

Figure 3:
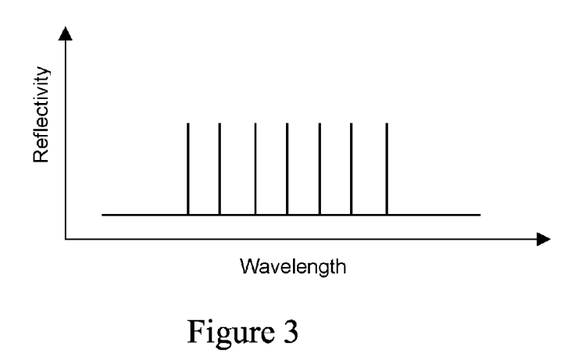
FIG. 3 is a graph showing a schematic reflection spectrum of a Bragg comb grating.

The reflector at the other end of a tunable laser may be arranged to produce a "comb" of reflective peaks at discrete wavelengths, as shown in FIG. 3. This comb-like spectrum can be produced by a segmented grating with a stepped pitch—i.e. a series of discrete grating segments, each of different pitches.

Figure 4:
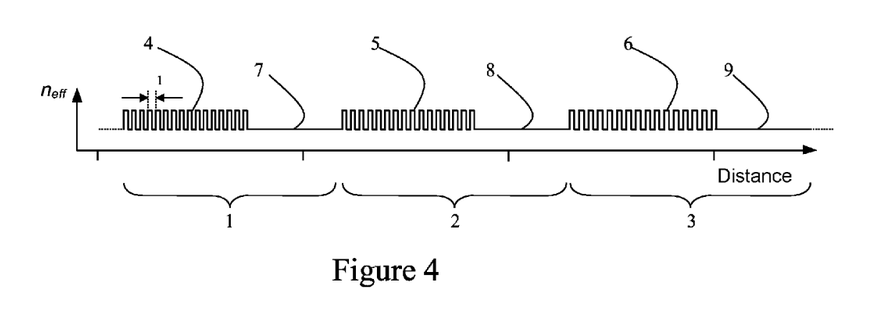
FIG. 4 is a schematic representation of a sampled Bragg grating.
Figure 5:
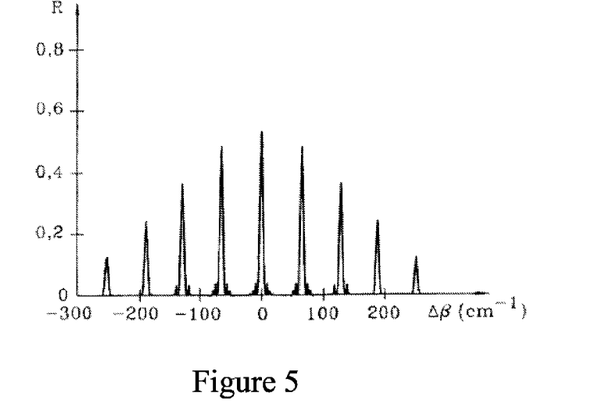
FIG. 5 is a graph showing the reflection spectrum of the grating of FIG. 4.

An alternative form of comb grating is known as a "sampled grating" and an example is shown schematically in FIG. 4. The DBR comprises a repeating pattern of units 1, 2, 3, each unit comprising a constant pitch grating 4, 5, 6 followed by a region 7, 8, 9 from which the grating is absent. Sampled gratings are described, for example, in Amman and Buus (ISBN 0890069638—mentioned above) and U.S. Pat. No. 6,141,370. The grating-less regions 7, 8, 9 are much greater in length than the grating period $\Lambda_1$. DBRs of this form produce a comb of reflection peaks with a $sinc^2$ envelope function, i.e. the envelope function is peaked at a central maximum, falling away at the sides, such that reflective peaks away from the centre of the operating range typically have a weaker reflection, as shown in FIG. 5. The shape of these DBRs makes it difficult to operate two of them together with different peak spacings in a Vernier manner, as described in U.S. Pat. No. 4,896,325.

The sampled grating can be modified to produce a flat topped comb-like reflector (as shown in FIG. 3) by replacing the constant pitch gratings in each unit by chirped gratings, as described in U.S. Pat. Nos. 5,325,392 and U.S. Pat. Nos. 6,141,370. Such gratings are known as "superstructure gratings" or "periodically chirped gratings". More complex non-binary superstructure gratings are also known.

Figure 6:
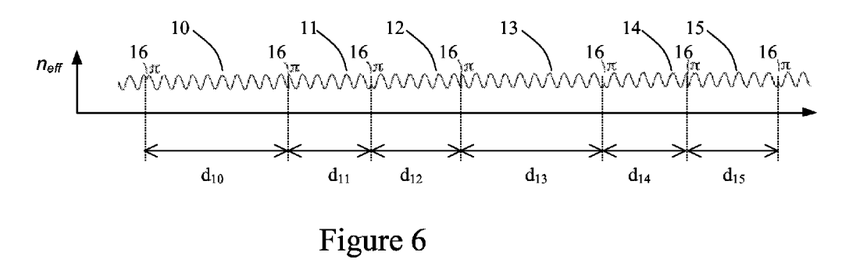
FIG. 6 is a schematic representation of a Bragg phase change grating.

Another DBR that produces a comb-like reflection spectrum is known as a "phase change grating" and an example is shown in FIG. 6. Such a grating typically comprises sections of constant pitch grating 10-15 separated by phase changes 16 of $\pi$ radians, and by careful design can produce a comb of reflection peaks within a substantially flat topped envelope function, as explained in U.S. Pat. No. 6,345,135. Such gratings require complex computer modelling and optimisation, and are considered to be particularly sensitive to design variations.

In a tunable laser the relative reflective strength of the different gratings, e.g. front and rear gratings, is important, as this allows for optimisation of the ratio of power emitted from the front and the rear. Some tunable lasers comprise more than two DBRs, and the relative reflective strengths need careful balancing. Controlling the relative strengths of these gratings can be achieved in a number of ways.

One known method for controlling the reflective strength of a grating involves changing the relative widths of "marks" and "spaces" in the grating. As described, for example, in Amann & Buus (ISBN 0890069638—mentioned above), the reflective strength is highest when the mark:space width ratio of first order gratings is close to 1:1. This method of strength control can be used for all types of gratings, although for very weak gratings it affects the spectral profile to some extent. However, producing gratings with different mark:space width ratios requires separate lithography and etching to produce each grating, and this adds to the number of steps required in the production of the laser. This results in a process that is difficult to control with the necessary precision, as well as increasing the time and expense required.

Another method for controlling the reflective strength of a grating involves changing the length of the grating. It is known that the reflective intensity of a grating is a function of the length of the grating. However, changing the length of a grating (whilst maintaining the range of pitches) also has an effect on the profile of the reflection. The reflection peaks of a constant pitch grating become both narrower and stronger with increasing grating length. The reflection profile of a chirped grating becomes stronger with increasing length, although other shape changes will be less significant.

In addition, the reflective intensity of a grating saturates as the length is increased beyond a certain point. Most light is reflected at the front of a DBR, with diminishing returns being obtained for lengthening the grating, and the grating as a whole experiences an approximately exponential decay-like level of light as a function of distance from the input. Furthermore, a DBR is inherently lossy, which further contributes to the diminishing returns from increasing the length.

There is also a particular problem with reducing the length of a phase change grating to reduce its reflectivity: the reduction in length causes the individual peaks of the reflection spectrum to become wider, which can reduce the performance of a DBR laser.

When a DBR is used at the front of a semiconductor laser, increasing the strength of the grating above a certain level will reduce the laser's output power, and so the reflectivity has to be restricted. When a DBR is used as a rear reflector in a semiconductor laser, it is typically of a high reflectivity, in which case there would be little change produced by increasing the grating length.

In accordance with one aspect of the present invention there is provided a tunable laser comprising a gain section and two or more reflectors, at least one of the reflectors being a Bragg grating, the grating comprising a reduced strength section comprising a periodic pattern of marks and spaces, the periodic pattern comprising a base order pattern from which at least some of the marks or spaces are missing, so that the reflective strength of the grating is controlled relative to the reflective strength of the or each other reflector. The reduced strength section may extend the whole length of the grating so that the whole grating is reduced in reflective strength.

Thus the strength of the grating may be controlled with no need to change the amplitude of the marks or the mark:space ratio.

Preferably the periodic pattern of the reduced strength section is defined by the base order pattern modulated by a higher order envelope function that determines which marks or spaces are missing from the base order pattern. In practice, the reduction in strength does not normally need to be high, and in a preferred embodiment one out of every N marks or spaces of the base order pattern is missing in the reduced strength section, where N is an integer greater than one.

The grating may be a chirped grating, in which case the period of the base order pattern varies along the length of the grating. Such a grating may be used in the front reflector of a tunable laser.

Alternatively, the grating may be a comb grating adapted to produce a reflection spectrum comprising a plurality of reflective peaks at discrete wavelengths. Such a grating is typically the rear reflector of a tunable laser.

The grating may be a stepped pitch grating comprising a plurality of grating sections, the period of the base order pattern of each section being different, wherein some or all of the grating sections are reduced strength sections having marks or spaces missing from their respective base order pattern.

In another embodiment, the grating is a phase change grating comprising a plurality of fixed pitch grating sections separated by phase changes of $\pi$ radians, wherein some or all of the grating sections are reduced strength sections having marks or spaces missing from the base order pattern.

It will be appreciated that two (or more) of the reflectors may be Bragg gratings, and one or more of these gratings may comprise a reduced strength section as described above. The two gratings may be a chirped grating as a front reflector and a comb grating as a rear reflector. Alternatively both gratings may be comb gratings. Other possible arrangements will be apparent to the worker skilled in the art. Generally, the reflective strength of the reflectors is controlled so that the front reflector has a relatively low reflective strength and the rear reflector has a relatively high reflective strength. In one embodiment the two gratings have a different order for the missing marks: one grating may have one out of every M marks (or spaces) missing, and the other may have one out of every L marks missing, where M and L are different integers. In another embodiment one grating may have marks (or spaces) missing and the other may not have any marks missing.

The use of two gratings with relative reflective strength controlled by selective deletion of lines from the base order pattern significantly improves the manufacturing process. Both gratings can now be manufactured in a single process step (for example by electron beam writing) with the same gratings process and etch depth for both, thereby reducing processing variation and increasing yield.

In accordance with another aspect of the present invention there is provided a Bragg grating adapted to produce a reflection spectrum comprising a comb of reflective peaks at discrete wavelengths, the grating comprising a plurality of grating sections formed by a base order periodic pattern of marks and spaces, the grating sections being separated by phase changes of $\pi$ radians, wherein some or all of the grating sections are reduced strength sections, each reduced strength section comprising a periodic pattern of marks and spaces defined by the base order pattern from which at least some of the marks or spaces are missing.

The use of a deleted lines scheme thus enables the reflective strength of a phase change grating to be easily controlled, despite the sensitivity of such gratings to manufacturing variations.

Preferably the pattern of each reduced strength section is defined by the base order pattern modulated by a higher order envelope function that determines which marks or spaces are missing from the base order pattern. In a preferred embodiment, one out of every N marks or spaces of the base order pattern is missing in each reduced strength section, where N is an integer greater than one. More preferably, one out of every three, five or seven marks or spaces is missing from the base order pattern in each reduced strength section.

In accordance with another aspect of the present invention there is provided a method of balancing the relative reflective strengths of reflectors formed by Bragg gratings in a tunable laser, wherein the gratings comprise sections formed by a base order periodic pattern of marks and spaces, the method comprising removing some of the marks or spaces from at least one of the gratings to form a periodic pattern defined by the base order pattern from which some of the marks or spaces are missing. The marks and spaces are preferably formed in a waveguide by electron beam lithography.

In accordance with another aspect of the present invention there is provided a method of manufacturing a reduced strength Bragg grating adapted to produce a reflection spectrum comprising a comb of reflective peaks at discrete wavelengths, comprising forming a plurality of grating sections comprising a base order periodic pattern of marks and spaces, the grating sections being separated by phase changes of π radians, and forming some or preferably all of the grating sections as reduced strength sections, each reduced strength section comprising a periodic pattern of marks and spaces defined by the base order pattern from which at least some of the marks or spaces are missing.

Some preferred embodiments of the invention will now be described by way of example only and with reference to the accompanying drawings, in which.

Figure 7:
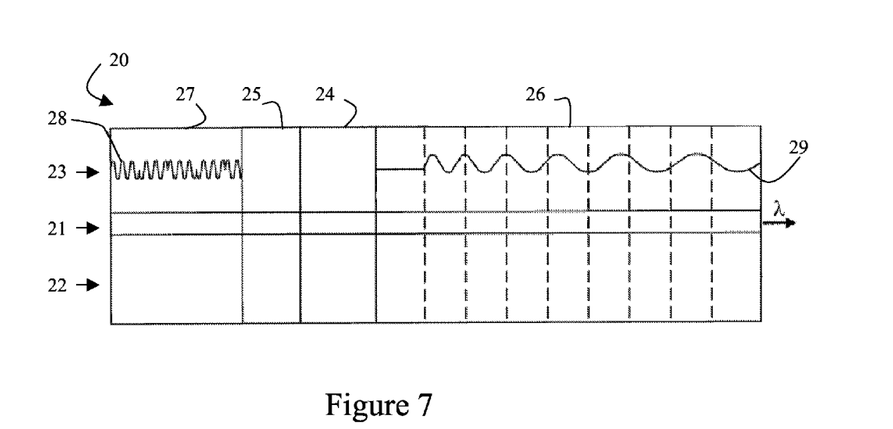
FIG. 7 is a schematic representation of a tunable laser.

FIG. 7 is a schematic representation of a typical tunable laser 20, of the type described in WO 03/012936. As is conventional, the laser is built up in a series of layers, with a waveguide layer 21 bounded by a lower layer 22 and upper layer 23. The structure may include further layers, but they are not material to the invention and are not shown for clarity.

The laser 20 has four principal sections: a gain section 24, a phase change section 25 and front and rear reflecting sections 26, 27. The rear reflecting section 27 has a phase shifted distributed Bragg reflector 28 (similar to that shown in FIG. 6) formed in the upper layer 23. This reflector produces a comb of reflectance peaks at separated wavelengths. The front reflecting section 26 consists of a linearly chirped grating 29 of progressive pitch variation along the length. It will be noted that the chirped reflector of FIG. 8 is represented as a sinusoidal variation in refractive index, whereas the chirped reflector previously shown in FIG. 1 is castellated. The physical shape depends largely on the manufacturing method used to produce the grating. Both types of grating work in a similar manner and for the present invention may be considered interchangeable.

The laser operates by injecting sufficient current into the gain section 24 to create a population inversion of charge carriers, and by making a portion of the front grating 26 reflect light of a specific wavelength preferentially, so that the rear grating 27 selectively reflects light of that particular wavelength. The front grating will reflect back the light at that wavelength, so that the wavelength will become the preferred or enhanced wavelength and the laser will start to lase at that wavelength. The mechanism by which a preferred wavelength is selected is well known and described, for example, in WO 03/012936 and will not be reproduced here.

The relative reflective strengths of the front grating 26 and rear grating 27 are important to the operation of the laser: in general, the front grating 26 should have a relatively low reflectivity and the rear grating 27 should have a relatively high reflectivity. In order to reduce the strength of either of these gratings, a "deleted lines" approach is used. This approach is particularly suitable for gratings written by e-beam lithography and is described in detail in British patent no. 2418995. An explanation is also given with reference to FIGS. 8 and 9.

Figure 8A:
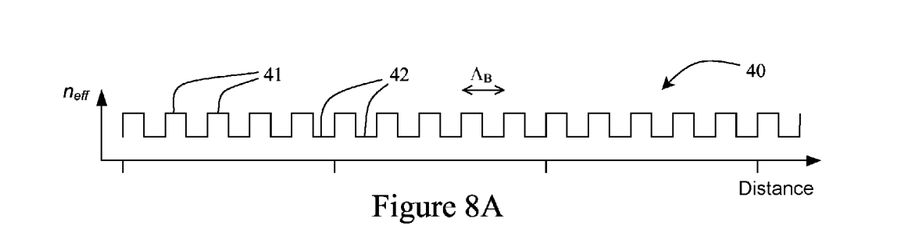
FIGS. 8A to 8C are schematic representations of a grating region showing how the local reflection strength can be reduced by line deletion.

FIG. 8A is a schematic diagram of a section of grating 40 comprising a plurality of marks 41 separated by spaces 42, with a pitch $\Lambda_B$. The grating section 40 forms part of a larger chirped or comb grating, but over the distance shown in FIG. 8A the pitch $\Lambda_B$ does not change appreciably. The mark:space ratio of this grating section 40 is 1:1 and the grating is first order (with respect to light in the waveguide).

Figure 8B:
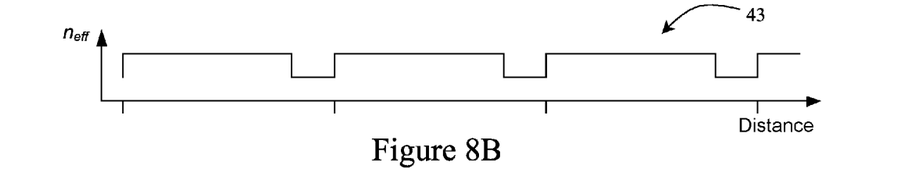
Figure 8C:
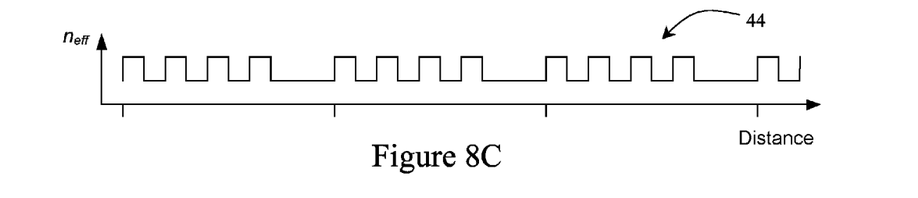

FIG. 8B shows a fifth order binary envelope function 43 which is used to modulate the grating section 40, such that every fifth mark 41 of the first order grating is 'deleted' to produce a new grating section 44, as shown in FIG. 8C. This produces a grating section 44 with a lower reflectivity than the complete first order grating section 40. It may be visualised either as a first order grating section with every fifth line deleted, or as a combination of a first order and a fifth order pattern. Other higher order envelopes may also be applied to the first order grating 40 to reduce the reflectivity still further, for example by deleting two, three or four marks out of every five, or by using a different order grating as the higher order grating.

A useful short-hand notation may be used to describe the resultant design of grating, type "x/m", where m is the order of the modulation envelope function compared with the base order, and where x is the number of marks per period of the envelope function rebased with respect to the base order. In the modified grating section 44 shown in FIG. 8C the modulation function 43 is fifth order compared to the base first order grating section 20 (so m=5) and four marks remain per envelope period (so x=4). The grating section 24 shown in FIG. 8C is thus denoted ⅘ type, and is itself a fifth order grating section.

Figure 9A:
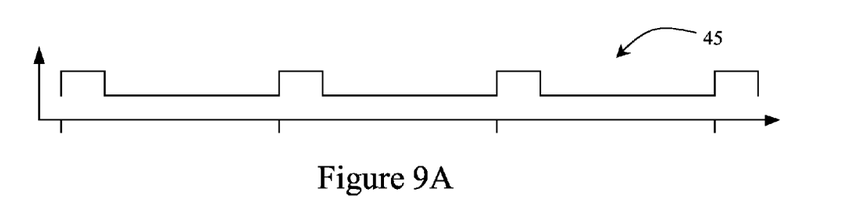
FIGS. 9A and 9B show an alternative scheme for line deletion.
Figure 9B:
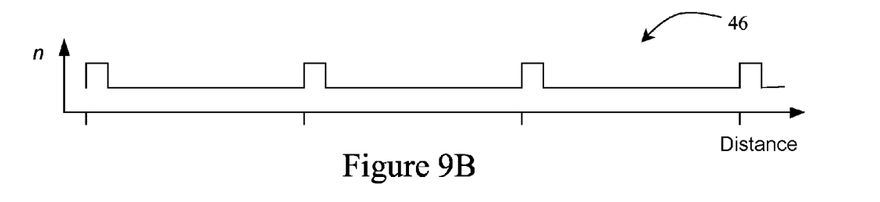

A different fifth order binary envelope 45 and corresponding ⅕ type grating section 46 are shown in FIGS. 9A and 9B. The reflection strength of the ⅕ type grating section 46 is lower still than that of the ⅘ type grating section 44. Generally speaking, the reflective strength of a grating section is related to its x/m value relative to the base grating section.

Figure 10:
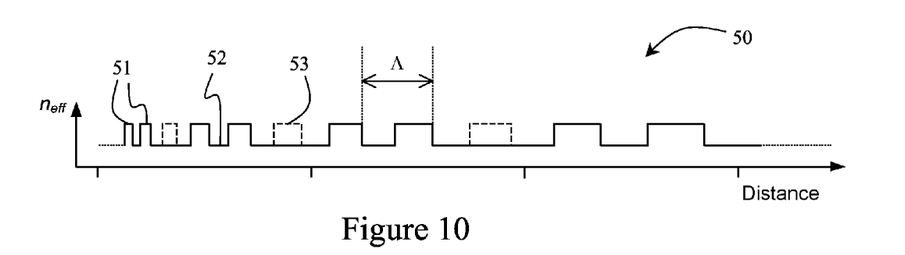
FIG. 10 is a schematic representation of a chirped grating with reflection strength reduced by line deletion.

A reduced strength grating section such as the ⅘ grating section 46 or ⅕ grating section 44 may be incorporated into a chirped grating (such as that shown in FIG. 1). In practice, the whole length of the grating will normally be modified so that the reflective strength of the whole grating is reduced. FIG. 10 is a schematic representation of a reduced strength chirped grating 50 of ⅔ type. The grating comprises a base order pattern having marks 51 and spaces 52 with a pitch Λ increasing along the length of the grating (as in FIG. 1). Every third mark 53 (shown in broken lines) is missing. The overall reflective strength of the grating 50 is thus reduced.

Figure 11:
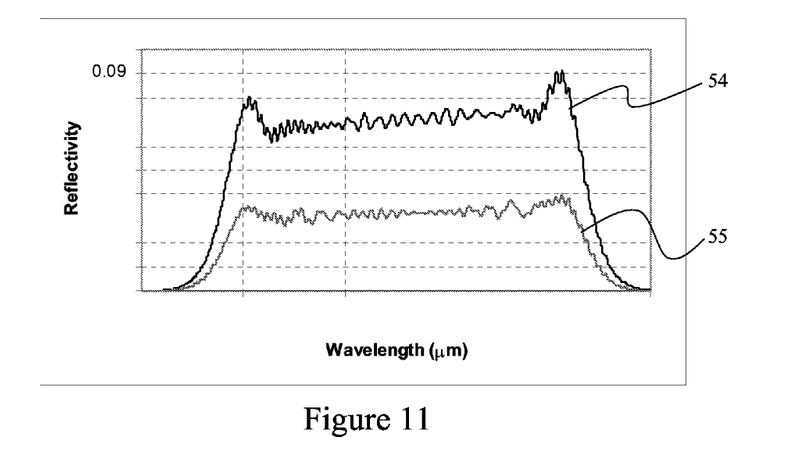
FIG. 11 is a graph comparing the reflection spectra of a full strength chirped grating and the reduced strength grating of FIG. 10.
Figure 12A:
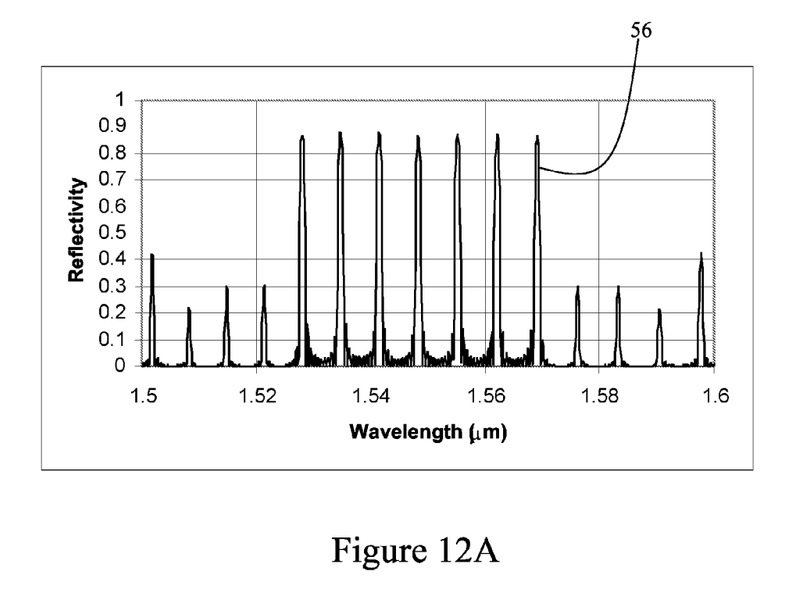
FIG. 12A is the reflection spectrum of a full strength phase change grating.
Figure 12B:
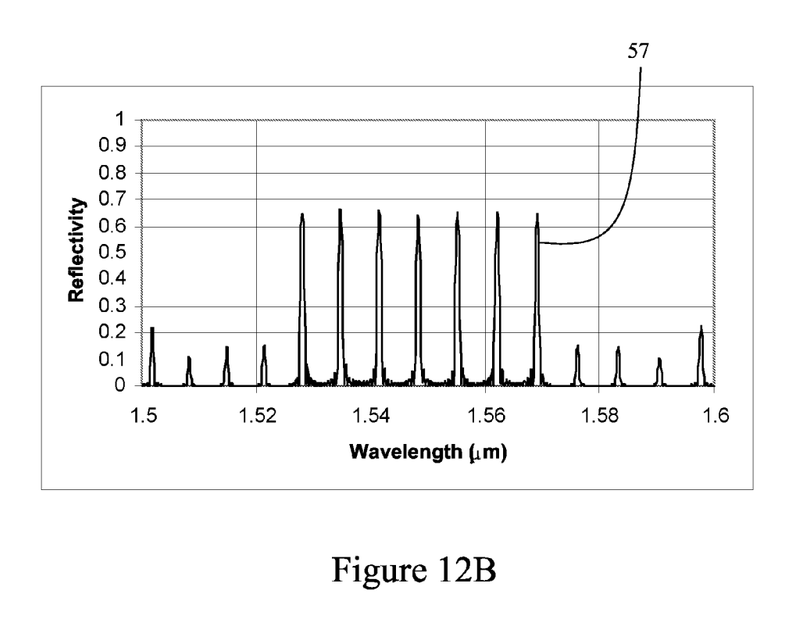
FIG. 12B is the reflection spectrum of a reduced strength phase change grating with one out of every three marks missing.

This reduction in reflective strength is shown in FIG. 11. The reflection spectrum 54 of a "full strength" chirped grating (similar to the grating of FIG. 1) is shown, together with the reflection spectrum 55 of a ⅔ type chirped grating similar to the grating 50 shown in FIG. 10. It can be seen that the removal of every third line has led to a significant reduction in reflectivity at all wavelengths in the spectrum 55 of the ⅔ type grating. It will also be noted that the reduction is substantially independent of wavelength. Thus the wavelength response of the grating is largely unchanged.

Reduced strength grating sections can also be incorporated into stepped pitch gratings, in which case each grating section has a different pitch, but each section is of the type x/m, as described above. In an exemplary embodiment, one out of every three marks will be missing throughout the grating.

The same approach can theoretically also be used for sampled gratings, although in practice there are typically so few lines already in each grating section that the reflective strength is already low and the "deleted lines" system is less likely to be necessary. In addition, if it should be desirable to reduce the strength of the grating by reducing the number of teeth, this could be better achieved by reducing the grating burst length (which also advantageously flattens the sinc$^2$ profile of the reflection spectrum). Furthermore, sampled gratings are commonly written holographically. One of the particular advantages of the deleted lines approach to strength reduction is its application to electron beam writing, and in general this would not apply to sampled gratings.

It has been found that the control of reflective strength by the deleted lines technique even works for phase change gratings such as that shown in FIG. 6. This is unexpected given the sensitivity of phase change gratings to design variances. The application of the technique is as described above: (m−x) marks out of every m are removed from each grating section between the π phase changes. FIG. 11A shows the reflection spectrum 56 of a "full strength" phase change grating such as that shown in FIG. 6. FIG. 11B shows the reflection spectrum 57 (at the same scale) of a ⅔ type phase change grating with every third mark missing from each grating section. It can easily be seen that the reflectivity strength of each wavelength peak has reduced by about a third.

In practice, the deleted lines scheme is generally successful with phase change gratings as long as not too few marks are removed. The proportion of marks deleted from each section should be substantially uniform throughout the grating. Since some sections are short, this proportion will not be uniform if too few marks are deleted. Preferably the length of the higher order envelope function is less than the length of the shortest grating section.

Referring back to FIG. 7, it can thus be seen that the reflective strength of the front reflector 26 and rear reflector 27 can be controlled using the deleted lines technique. It is then straightforward to ensure that the relative reflective strength of the two reflectors is correctly balanced. The combination of different x/m combinations for the different gratings enables control of the relative reflective strength of the gratings.

In a further embodiment, the technique may be used to balance the reflective strengths of two or more DBR gratings in a multiple section DBR laser.

It will be appreciated that variations from the above described embodiments may still fall within the scope of the invention. For example, a tunable laser has been described having a comb grating as a rear reflector and a chirped grating as a front reflector, but the invention may equally well be used with other designs of tunable laser. For example, WO 03/012936 also describes a laser having a phase change grating as a rear reflector and a segmented grating as a front reflector in addition to the phase change grating/chirped grating laser described above. In this case, the reflective strengths of the phase change grating or the segmented grating, or both, may be controlled by line deletion. Other tunable lasers have phase change gratings as both front and rear reflectors and the relative reflective strengths of such gratings may be controlled as described above. It will also be appreciated that tunable lasers may include Bragg gratings alongside other forms of reflector such as facets. The invention may still be applied to such lasers by controlling the reflective strength of the Bragg grating to balance with the other reflector.

Furthermore, specific examples have been given of ⅔ type chirped and phase change gratings, but it has been found that removal of one out of every five or one out of every seven lines from a chirped or phase change grating is also effective. Other possible schemes will be apparent to one skilled in the art. As mentioned above, it is the combination of different x/m combinations that enables control of the relative reflective strength of the gratings.

It will also be appreciated that the deleted lines technique may be used to balance the strengths of different segments within a single Bragg grating. For example, those segments closer to the gain section of a laser might be weaker, in order to compensate for the greater attenuation that reflections from the more distant segments experience. Alternatively, some portions of a grating may be reduced in strength relative to other portions in order to compensate for a non-uniform wavelength profile in the gain section, as described in British application no. 0519799.1.

The invention claimed is:

1. A tunable laser comprising a gain section and two or more reflectors, at least one of the reflectors being a Bragg grating, the grating comprising a reduced strength section comprising a periodic pattern of marks and spaces, the periodic pattern comprising a base order pattern from which at least some of the marks or spaces are missing, the periodic pattern being defined by the base order pattern modulated by a higher order envelope function that determines which marks and spaces are missing from the base order pattern, so that the reflective strength of the grating is controlled relative to the reflective strength of at least one other of the two or more reflectors.

2. The tunable laser of claim 1, wherein n out of every m marks or spaces of the base order pattern is missing in the reduced strength section, where m is an integer greater than n, and n is one or an integer greater than one.

3. Previously Presented) The tunable laser of claim 1, wherein the reduced strength section extends the whole length of the grating.

4. The tunable laser of claim 1, wherein the grating is a chirped grating, and wherein the period of the base order pattern varies along the length of the grating.

5. The tunable laser of claim 1, wherein the grating is a comb grating adapted to produce a reflection spectrum comprising a plurality of reflective peaks at discrete wavelengths.

6. The tunable laser of claim 5, wherein the grating is a stepped pitch grating comprising a plurality of grating sections, the period of the base order pattern of each section being different, and wherein some or all of the grating sections are reduced strength sections having marks or spaces missing from their respective base order pattern.

7. The tunable laser of claim 5, wherein the grating comprises a plurality of grating sections formed by a base order periodic pattern of marks and spaces, the grating sections being separated by phase changes of $\pi$ radians, wherein some or all of the grating sections are the reduced strength sections, each reduced strength section comprising the periodic pattern of marks and spaces defined by the base order pattern from which at least some of the marks or spaces are missing.

8. The tunable laser of claim 1, wherein at least two of the reflectors are Bragg gratings, and one or more of the gratings comprises a reduced strength section comprising a base order periodic pattern of marks and spaces from which at least some of the marks or spaces are missing to so that the relative strength of the two gratings relative to each other is controlled.

9. The tunable laser of claim 8, wherein the reduced strength section of one of the gratings has one out of every M marks or spaces missing from its base order pattern, and the reduced strength section of the other of the gratings has one out of every L marks or spaces missing from its base order pattern, where M and L are different integers greater than one.

10. The tunable laser of claim 8, wherein the reduced strength section of one of the gratings has one out of every M marks or spaces missing from its base order pattern, and the other grating has no marks or spaces missing from its base order pattern.

11. The tunable laser of claim 1, wherein the reflectors comprise a front reflector and a rear reflector bounding the gain section, and wherein the Bragg grating with the reduced strength section forms at least part of the front reflector or the rear reflector.

12. The tunable laser of claim 11, wherein the reflective strength of the reflectors is controlled so that the front reflector has a relatively low reflective strength and the rear reflector has a relatively high reflective strength.

13. The tunable laser of claim 11, wherein the front reflector is a chirped grating and the rear reflector is a comb grating.

14. The tunable laser of claim 11, wherein the front and rear reflectors are comb gratings.

15. The tunable laser of claim 1, wherein the reduced strength section compensates for a non-uniform wavelength gain profile in the gain section of the laser.

16. A method of balancing the relative reflective strengths of reflectors formed by Bragg gratings in a tunable laser, wherein the gratings comprise sections formed by a base order periodic pattern of marks and spaces, the method comprising removing some of the marks or spaces from at least one of the gratings to reduce the strength of said at least one grating by forming a periodic pattern defined by the base order pattern from which some of the marks or spaces are missing, wherein the periodic pattern is defined by the base order pattern modulated by a higher order envelope function that determines which marks and spaces are missing from the base order pattern.

17. The tunable laser of claim 16, wherein n out of every m lines is removed from at least one of the gratings, where m is an integer greater than n, and n is one or an integer greater than 1.

18. The tunable laser of claim 16, wherein the marks and spaces are formed in a waveguide by electron beam lithography.

* * * * *